United States Patent [19]
So et al.

[11] Patent Number: 5,877,529
[45] Date of Patent: Mar. 2, 1999

[54] MOSFET TERMINATION DESIGN AND CORE CELL CONFIGURATION TO INCREASE BREAKDOWN VOLTAGE AND TO IMPROVE DEVICE RUGGEDNESS

[75] Inventors: Koon Chong So; Danny Chi Nim, both of San Jose; Fwu-Iuan Hshieh, Saratoga; Yan Man Tsui, Union City; True-Lon Lin, Cupertino; Shu-Hui Cheng, Milpitas, all of Calif.

[73] Assignee: MegaMOS Corporation, San Jose, Calif.

[21] Appl. No.: 978,667

[22] Filed: Nov. 26, 1997

Related U.S. Application Data

[63] Continuation of Ser. No. 638,606, Apr. 26, 1996, abandoned.

[51] Int. Cl.[6] ............................ H01L 29/76; H01L 29/94; H01L 23/58
[52] U.S. Cl. ............................ 257/341; 257/339; 257/494
[58] Field of Search .................................. 257/339, 341, 257/342, 490, 491, 494, 495

[56] References Cited

U.S. PATENT DOCUMENTS 5,072,266 12/1991 Bulucea ..................................... 257/339
5,170,241 12/1992 Yoshimura et al. ..................... 257/339
5,430,314 7/1995 Yilmaz ..................................... 257/328

Primary Examiner—Steven H. Loke
Attorney, Agent, or Firm—Bo-In Lin

[57] ABSTRACT

Improved power MOSFET structure, and fabrication process are disclosed in this invention to achieve higher breakdown voltage and improved device ruggedness. The power transistor includes a core cell area which includes a plurality of power transistor cells and a termination area. The power transistor further includes an outer pickup guarding ring, disposed in the termination area guarding the core cell area, for picking up free charged-particles generated in the termination area for preventing the free charged particles from entering the core cell area. In another preferred embodiment, the power transistor further includes an inner pickup guarding fence and blocks, disposed between the termination area and the core cell area for picking up free charged-particles not yet picked up by the outer pickup guarding ring for preventing the free charged particles from entering the core cell area.

16 Claims, 12 Drawing Sheets

5,877,529

MOSFET TERMINATION DESIGN AND CORE CELL CONFIGURATION TO INCREASE BREAKDOWN VOLTAGE AND TO IMPROVE DEVICE RUGGEDNESS

This application is a continuation of application Ser. No. 08/638,606, filed Apr. 26, 1996, now abandoned.

BACKGROUND OF THE INVENTION

1. Field of the Invention

This invention relates generally to the structure and fabrication process of power MOSFET transistors. More particularly, this invention relates to a novel and improved MOSFET termination layout design and core cell configuration in order to increase the breakdown voltage in the termination area and to improve the device ruggedness by eliminating incidental turning-on of the parasitic bipolar transistors whereby the damages caused by snapback voltage may be prevented.

2. Description of the Prior Art

The concern of device damages caused by early breakdown, particularly, breakdown in the termination area for a power MOSFET transistor with smaller cells, often becomes a technical limitation faced by device designers. The maximum blocking voltage and the conditions leading to a breakdown for a power MOSFET are dependent upon the spacing of the cells in the active core cell area and the configuration of the device termination. For the power MOSFET with small transistor cells, the depletion layer curvature is relatively larger at the edge junction when the MOSFET is under reverse bias, and the breakdown most likely occurs at the termination areas near the edge of the device. When an avalanche breakdown occurs in the termination area, large number of free electrons and holes are generated. For a N-channel device, the free electrons flows down-wardly to the drain electrode while the holes are influenced by the negative voltage of the source electrodes to migrate laterally toward the core cell area. Before these holes are finally "picked up" by the source electrodes, due to the lateral migration of large number of holes through the $N^+$ source regions underneath the source electrodes, the parasitic bipolar transistor of the cells may be incidentally turned on. A snapback voltage caused by the turning-on of the parasitic bipolar may often cause a permanent damage to the MOSFET cells.

FIG. 1 is a partial top view of the MOSFET device 10 with the core cell area 40 and the termination area 50. There are a plurality of cells each includes source 30 surrounded by p-body 25 and the cells are arranged in a square-on-square configuration. In the termination area, the polysilicon gates are extended as "poly-fingers" 72 from the core cell area 40 outwardly to the termination area 50 with a gate runner 76 connected to these poly fingers 72 with a plurality of gate contacts, i.e., poly contact 70 form thereon. With such a layout, suppose that the width of the poly finger 72 is approximately X and the width of the gate runner 76 is Y, and X is approximately equivalent to Y. A breakdown is most likely to occur at the center of the block formed by the intersection of the gate runner 76 and the poly finger 72. The breakdown is caused by the extra length of the polysilicon Z, i.e., the diagonal distance, which has a length of:

$$Z = \sqrt{X^2 + Y^2} \quad (1)$$

Due to the longer length of poly in this diagonal direction, a breakdown is most likely to occur in the center portion of the intersecting square block formed by the gate runner 76 and the poly finger 72. This weak point of breaking down is caused by a longer distance of separation between the underneath p-body regions. Such longer distance of separations, i.e., a separation of Z, requires higher voltage before the depletion edge under the gate in these regions are be merged to form a shield for preventing a breakdown. The termination layout with the gate runner 76 to connect each poly fingers 72 thus generated breakdown weak points. An early breakdown in this configuration imposes more constraints to device design and performance limitations in addition to the concerns that device damages may occur caused by a snapback phenomena due to incidental turning-on of the parasitic bipolar transistor resulting from breakdown in the termination area.

FIGS. 2A and 2B shows a cross-sectional views along the lines of X—X' and Y—Y' in FIG. 1 respectively for the conventional N-channel MOSFET device 10. The MOSFET device 10 is supported on a $n^+$ substrate 15 with a $n^-$ doped epitaxial drain region 20 formed thereon. A plurality of p-body regions 25 and $n^+$ source regions 30 are formed on top of the drain region 20 as shown. The MOSFET device 10 is divided into a core cell area 40 and a termination area 50. A plurality of cells which include the p-body 25, the source regions 30, and a poly gate 35 are formed in the core cell area 40. As shown in FIG. 1, the source electrode (S) 60 is formed in the core cell area 40 while the gate runner (G) 70, the field plate (FP) 80, and the equal ring (EQR) 90 are formed in the termination area 50.

For a 30V rating device, when a breakdown occur at a breakdown voltage, e.g., a voltage between 36 to 40 volts, a large number of free electrons and holes are generated. For a high cell density MOSFET device with a high drain voltage, the breakdown is likely to occur in the termination area 50, e.g., at point 95 as that shown in FIGS. 2A and 2B. At the time of breakdown, for a N-channel MOSFET, the free electrons generated will flow down to the drain via the epi-layer 20 and the substrate 15. In the meantime, a large number of holes each carrying positive charge will migrate laterally moving toward the core cell area 40 under the influence of the source voltage applied through the source electrode 60 as that shown by the dotted lines 98. As these holes travel underneath the $n^+$ source region 30 via the p-body 25, a parasitic bipolar of near the pn-junction may be incidentally turned on. A bipolar snapback voltage may cause permanent damages to the MOSFET device 10. A break-down in the termination area 50 thus becomes a design limit for the MOSFET device. More stringent restrictions on the design limits and MOSFET performance characteristics are imposed due to this breakdown concern.

It should be noted that, in FIG. 2B along the line Y—Y', where a contact for the field plate 80 is formed in the termination area. A very small portion of holes, i.e., holes 99 as shown, may be picked up by this small contact window through a p+ region 25'. However, since the purpose of this metal layer is for connecting the poly field plate, via a cross-over near the gate pad region, to a source electrode at a ground voltage, the effect of charge pickup is insignificant The conventional MOSFET structure, even with the field plate contact distributed in the termination area, is not sufficient to prevent the MOSFET damages which may be caused by incidental turning on of the parasitic bipolar as the result of large inflow of holes due to a breakdown in the termination area.

Therefore, there is still a need in the art of power device fabrication, particularly for MOSFET design and fabrication, to provide an improved device layout and fabrication process that would resolve these difficulties.

SUMMARY OF THE PRESENT INVENTION

It is therefore an object of the present invention to provide an improved device configuration with novel termination layout and cell configuration to overcome the aforementioned limitations of early breakdown and to increase the device ruggedness for a power MOSFET transistor to resolve the difficulties encountered in the prior art.

Specifically, it is an object of the present invention to provide an improved MOSFET termination configuration wherein special layout strategies are implemented with special outer charged particle pickup guard ring, and inner guarding pickup fences, and dummy cells located at the edge of the active core cell area to prevent lateral flow of charged particles into the MOSFET cells whereby incidental turning-on of the parasitic bipolar may be eliminated.

Another object of the present invention is to provide an improved MOSFET configuration wherein special layout strategies are implemented with the gate runner removed from the termination area thus eliminated the intersecting block between the poly fingers and the gate runner whereby the breakdown weak points are eliminated.

Another object of the present invention is to provide an improved core cell configuration in coordination with the location of the poly fingers extended to the termination area wherein a dummy cell employed as a charged particle pickup guarding block is disposed near each poly finger to pickup the free charged particles which may travel through underneath the poly fingers thus providing effective pickup blocks preventing the free charged particles from entering into the core cell area.

Another object of the present invention is to provide a dummy pickup cell segment in the core cell area of an open stripe MOSFET device to act as a charged particle pickup cells thus blocking free charged particles from entering the core cell area.

Briefly, in a preferred embodiment, the present invention includes a power transistor includes a core cell area which includes a plurality of power transistor cells and a termination area The power transistor further includes an outer pickup guarding means, disposed in the termination area guarding the core cell area, for pciking up free charged-particles generated in the termination area for preventing the free charged particles from entering the core cell area. In another preferred embodiment, the power transistor further includes an inner pickup guarding means, disposed between the termination area and the core cell area for picking up free charged-particles not yet picked up by the outer pickup guarding means for preventing the free charged particles from entering the core cell area.

In an alternate preferred embodiment, the present invention discloses a MOSFET device formed in a semiconductor substrate including a core cell area comprising a plurality of cells each includes a drain region formed near a bottom surface of the substrate supporting a plurality of double-diffused vertical cells thereon. Each of the vertical cells including a pn-junction having a body region surrounding a source region and each of the vertical cell further including a gate above the pn-junction. The MOSFET device further includes a termination area which includes an outer pickup guarding ring including a ring of metal contact above and in electric contact with a corresponding ring of higher doped body-region for guarding the core cell area by picking up free charged-particles generated in the termination area to preventing the free charged particles from entering the core cell area.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 3A:
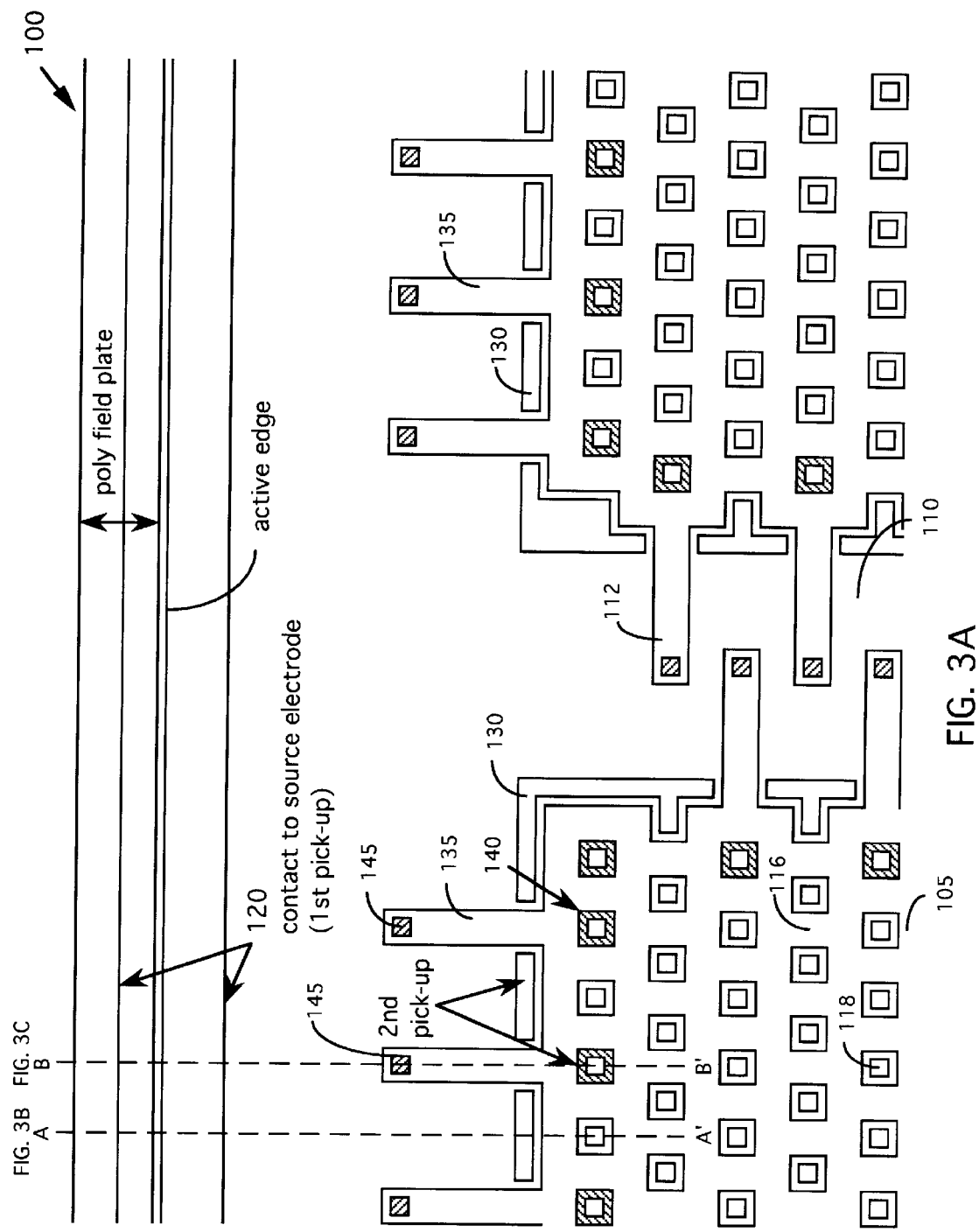
FIGS. 3A to 3C show a top view and cross sectional views of a MOSFET device with improved core cell configuration and novel termination layout design including charged particle pickup ring in the termination area and guarding pickup fence and pickup blocks in the core cell area.
Figure 3B:
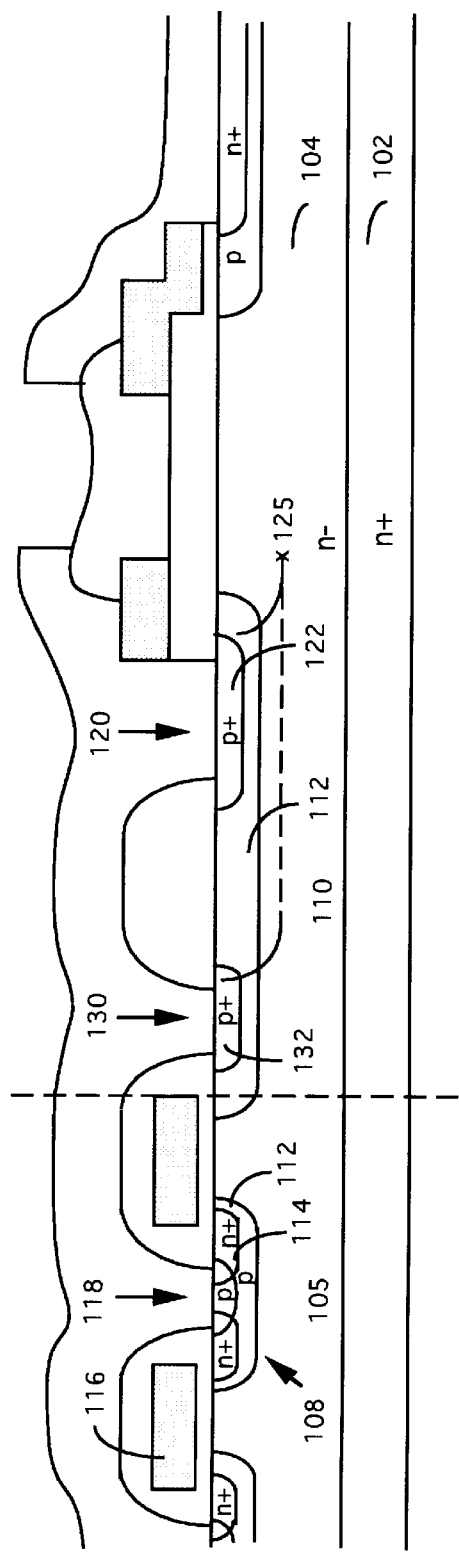
Figure 3C:
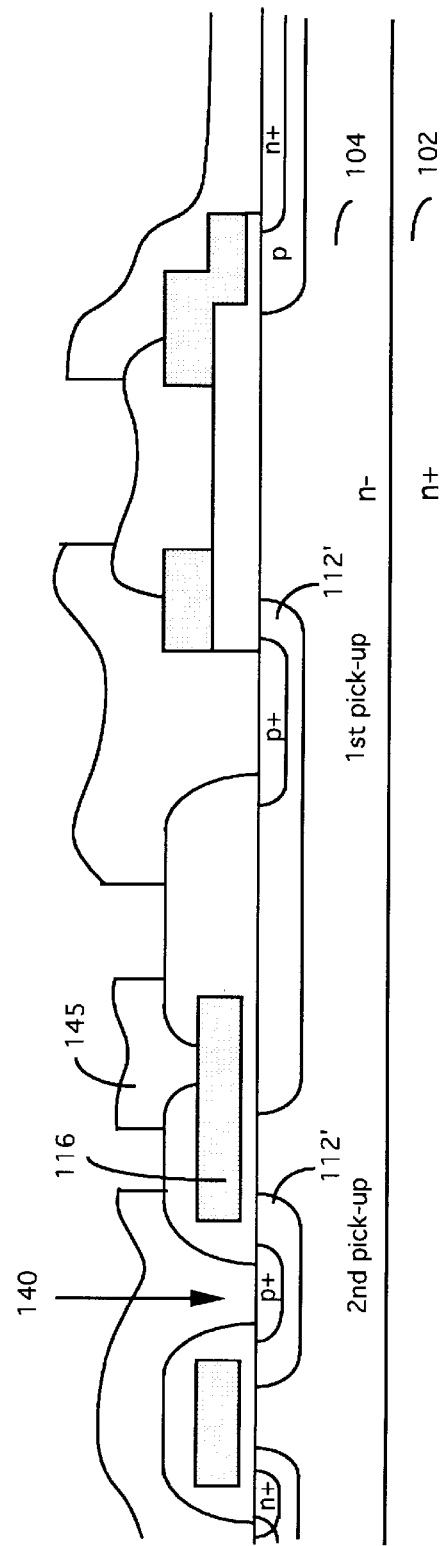

FIGS. 3A to 3C show a MOSFET device 100 of the present invention. FIG. 3A shows a top view of the MOSFET device includes a core cell areas 105, which includes a plurality of MOSFET cells 108. The MOSFET device 100 also includes a termination area 110 with a plurality of poly fingers 135 extended from the core cell area 105 to the termination area 110. FIGS. 3B and 3C show the cross sectional view along A—A' and B—B' lines as that depicted in FIG. 3A. Please refer to FIG. 3B, the MOSFET device 100 is support on a n– doped layer 104 formed on a n+ substrate 102. As a regular MOSFET device each of the MOSFET cells 108, in the core cell area 105, includes a p-body 112 formed underneath a N+ source region 114 with a gate 116 and a source contact 118 formed on the top surface as shown. The MOSFET device 100 is provided with several novel design features to improve the ruggedness of the device and to increase the breakdown voltage in the termination area. The MOSFET device 100 includes an outer charge-pickup guard-ring 120 formed as a p+ doped region 122 in contact with the source contact 118. When a breakdown occurs in the termination area, e.g., at point 125, the free holes generated, with each hole carrying a positive charge, are first picked up by this charge-pickup guard ring 120 where the holes flows from the breakdown point 125 to the source contact 118 via the p+ region 122. In addition to this outer charge-pickup guard ring 120, an inner charge-pickup guarding "fence" 130 is also provided along line A—A' which is formed as multiple segments of p+ regions 132 with direct contact with the source contact 118. Again, the free holes generated at the breakdown point 125 which are not yet picked up by the outer charge-pickup guard ring 120 are picked by this guarding fence 130.

FIG. 3C shows the cross section of the MOSFET device along line B—B'. The structure of the outer charge-pickup guard-ring 120 along this line is the same as that shown in FIG. 3B. However, as the inner charge-pickup guarding fence 130 is now broken to provide a space to form the poly-fingers 135, a dummy cell 140 is disposed right across from the poly fingers near the edge of the core cell area 105. The dummy cell 140 acts as an inner charge-pickup guarding block to prevent the holes, which are not yet picked up by the outer charge pickup guarding ring 120, from further entering the core cell area 105. The ruggedness of the device is improved because the probability of incidentally turning on the parasitic bipolar in the core cell areas 105 under each cell 108 is minimized when large number of charged particles are picked up before entering into the core cell area 105.

According to the above descriptions, the present invention discloses a power transistor 100 includes a core cell area 105 which includes a plurality of power transistor cells 108 and a termination area 110. The power transistor 100 further includes an outer pickup guarding means, e.g., the pickup guarding ring 120, disposed in the termination area 110 guarding the core cell area 105, for picking up free charged-particles generated in the termination area 110 for preventing the free charged particles from entering the core cell area 105. In another preferred embodiment, the power transistor 100 further includes an inner pickup guarding means, e.g., the inner pickup fence 130 and the inner pickup blocks 140, disposed between the termination area 110 and the core cell area 105 for picking up free charged-particles not yet picked up by the outer pickup guarding means 120 for preventing the free charged particles from entering the core cell area 105. In a preferred embodiment, the inner pickup guarding means further includes a pickup guarding fence 130 surrounding the core cell area 105 and a plurality of pickup guarding blocks 140 each includes a dummy transistor cell disposed in the core cell area 105 near the termination area 110 where the core cell area 105 is not surrounded by the pickup guarding fence 130.

Figure 1:
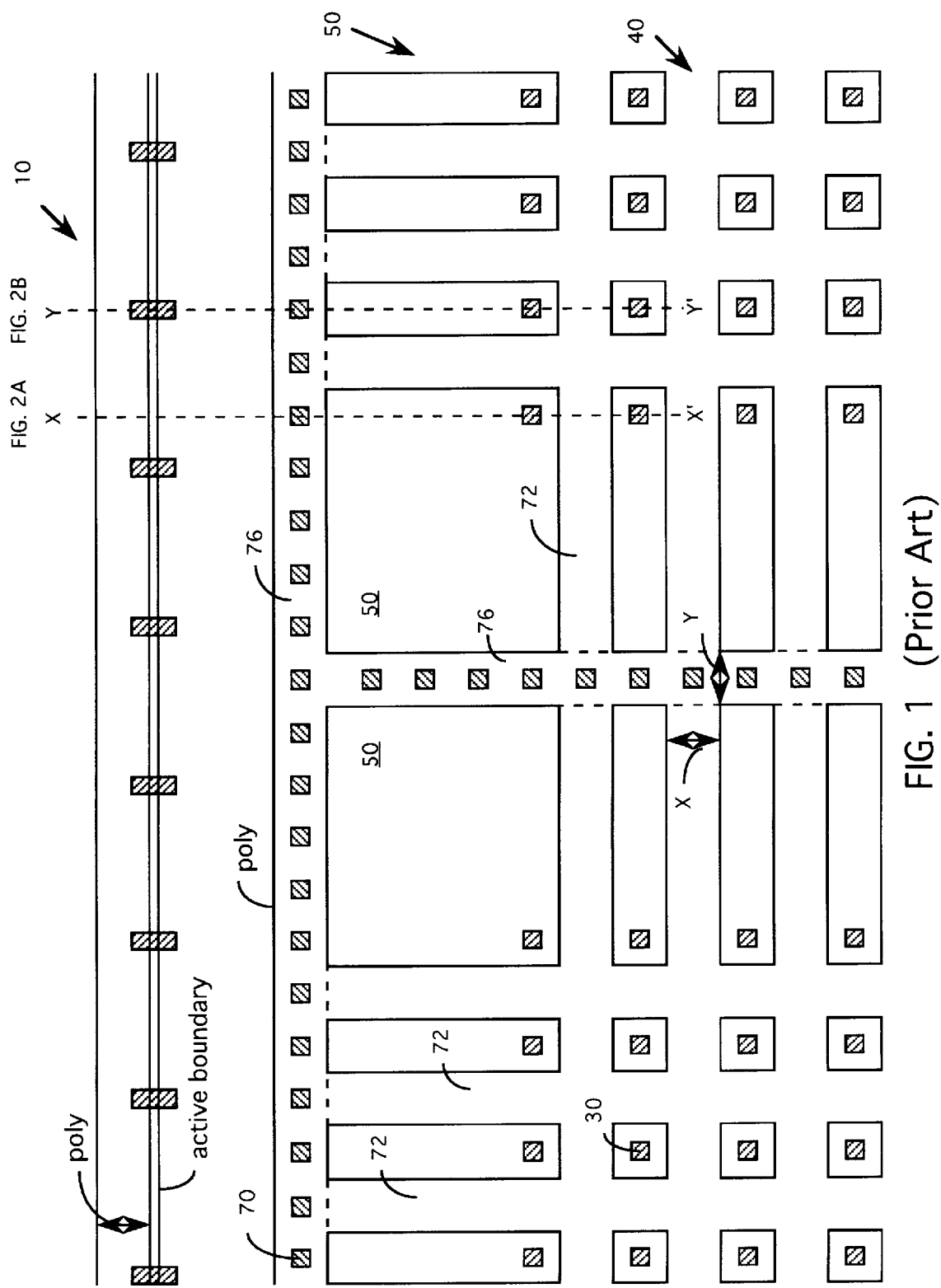
FIGS. 1 is a top view of the prior art MOSFET device showing the connection of the poly fingers by a gate runner thus creating vulnerable spots of early breakdown.

In addition to improvement in ruggedness, the MOSFET device 100 as shown in FIG. 3A further achieves another design advantage that the breakdown voltage in the termination area 110 is increased. Improvement made in the breakdown voltage is achieved by remove the conventional gate runner. In the conventional MOSFET device, a gate runner in the termination area is typically used for forming an elongated continuous gate contact (please refer to FIG. 1 for details). Instead of forming a conventional gate runner connected to all the poly fingers, a gate contact 145 is formed at the end of each poly finger 135. The weak points of earlier breakdown generated near the center of the block formed by the intersection of the poly fingers 135 and the gate runner as that in the prior art are eliminated. Increased breakdown voltage in the termination area, especially near the poly finger 135, is provided in the MOSFET 100 with the novel poly finger design in the termination area 110.

Figure 2A:
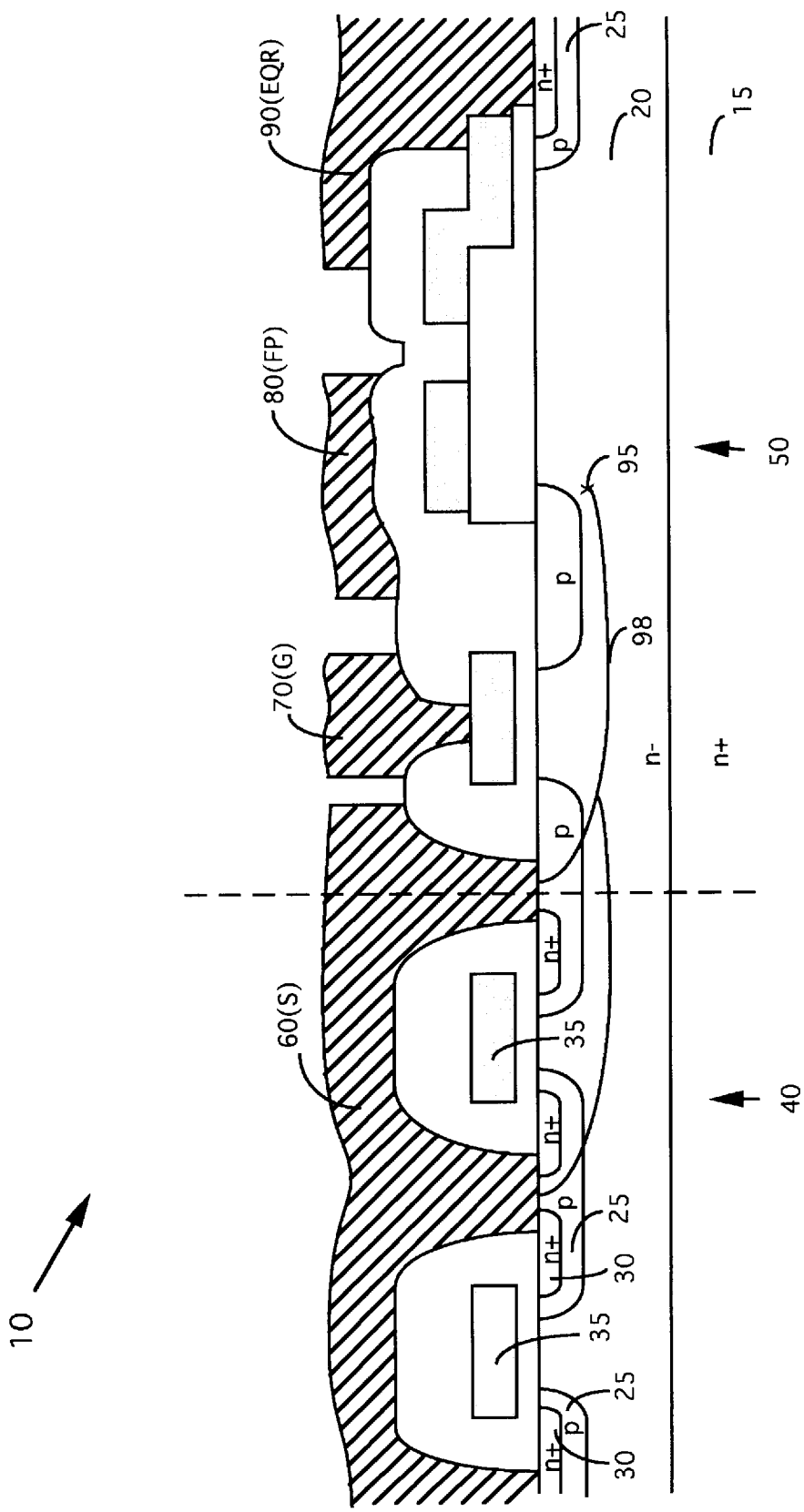
FIGS. 2A and 2B are cross-sectional views of a prior art structure of a general MOSFET device of FIG. 1.
Figure 2B:
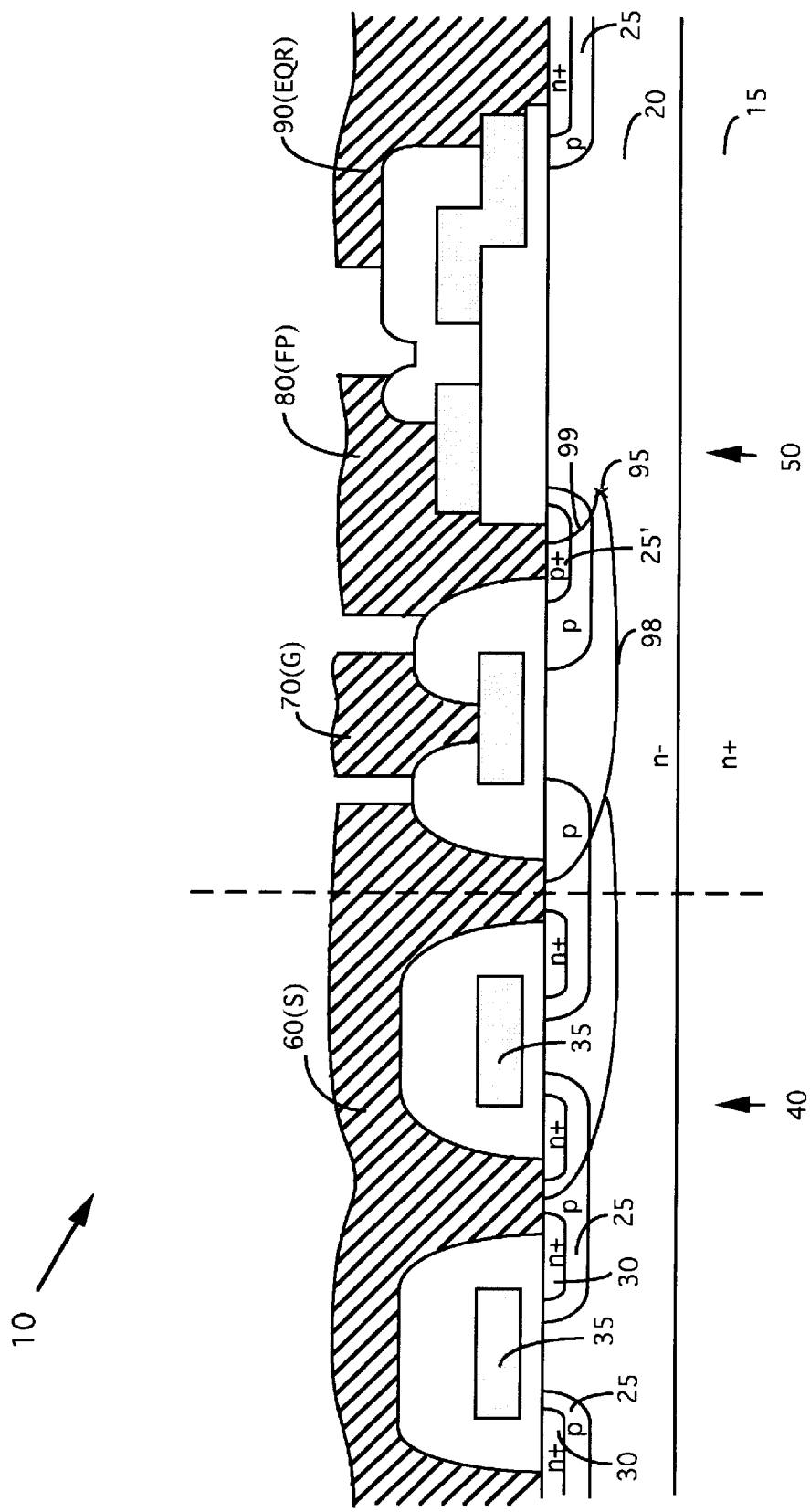
Figure 4A:
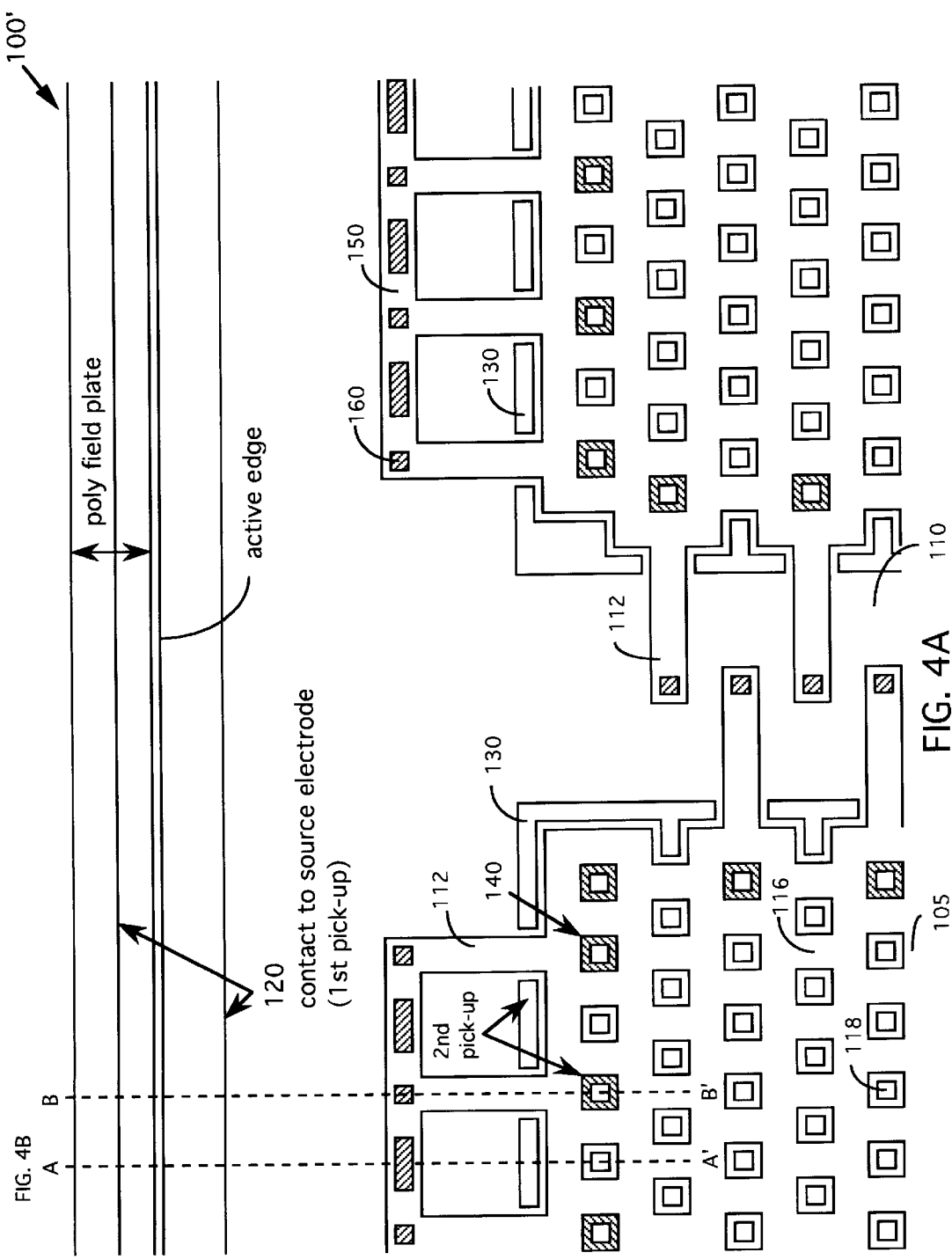
FIGS. 4A and 4B show a top view and a cross sectional view of a MOSFET device of the present invention.
Figure 4B:
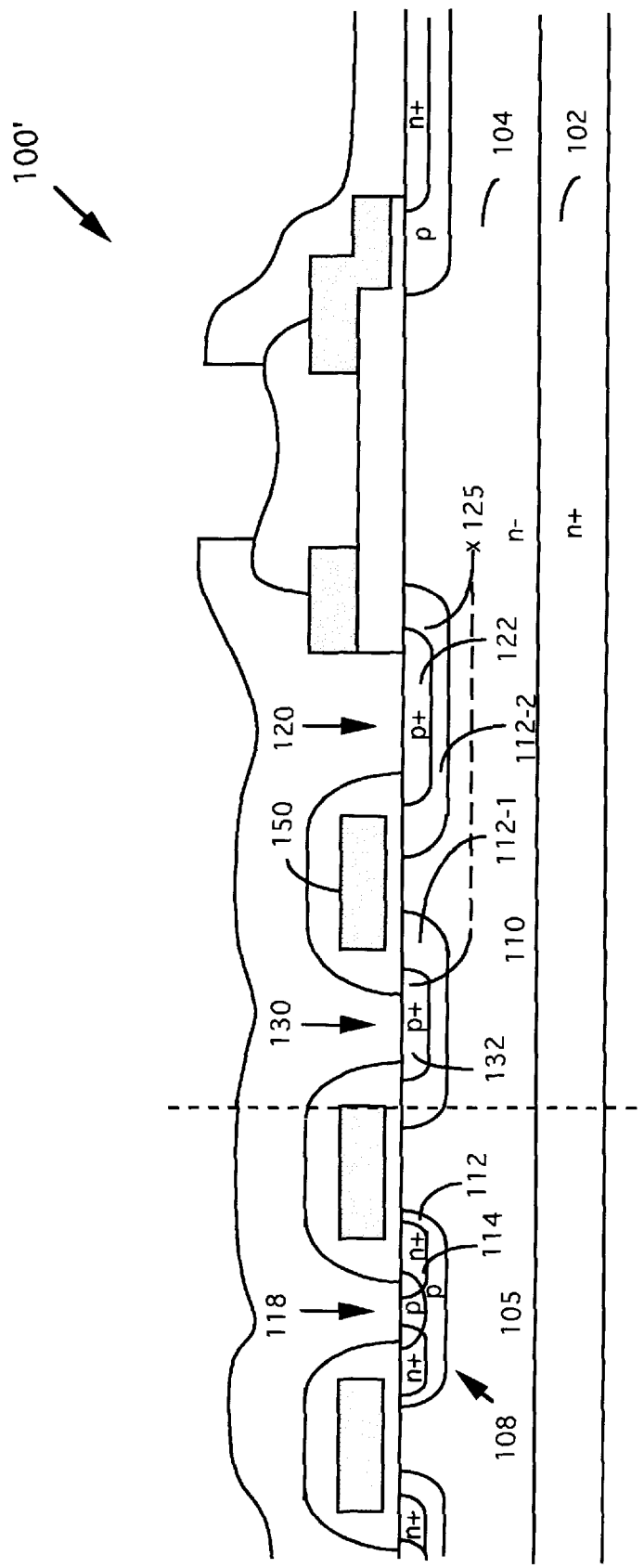

Removal of the traditional gate runner (please see FIG. 2 for the arrangement of gate runner 76), provide another advantage for the MOSFET device 100. For the purpose of illustration, FIG. 4A show another MOSFET 100'. Similar to the MOSFET device 100 shown in FIG. 3A to 3C, MOSFET 100' also includes the outer charge pickup guard ring 120 and the inner charge pickup guarding-fence 130 and the inner charge pickup guarding-blocks 140. The only difference between MOSFET device 100' with the MOSFET device 100 is the gate runner 150 formed in the termination area connected to all the poly fingers 135. The breakdown voltage in the termination area, for this MOSFET device 100' is lower than that of the MOSFET 100, particularly at the weak points 160. Furthermore, the pickup of the charge particles by the inner charge-pickup guarding-fence of the device 100', as that shown in FIG. 4B, is not as effective as device that of device 100. As shown in FIG. 4B which is a cross sectional view of FIG. 4A along a line A—A', due to the formation of the gate runner 150, the p-body disposed under the gate runner 150 is now segmented into two portions, i.e., 112-1 and 112-2. The pickup of the charge particles by the inner charge pickup guarding fence 130 is not as effective as that of device 100 shown in FIG. 3B. The charged particles, i.e., the free holes, generated from a breakdown at point 125 cannot travel directly along the p-body 112 for direct pickup by the inner pickup guarding fence 130 as that occurs in the device 100 due to the segmentation of the p-body region 112 underneath the gate runner 150 in the device 100'. Therefore, the removal of the gate runner 150 in the MOSFET device 100 provides several advantages wherein not only the breakdown voltage is increased by eliminating the breakdown weak points, but also the pickup of the charge particles can be more effectively carried out by the inner charge pickup guarding fence 130.

Figure 5:
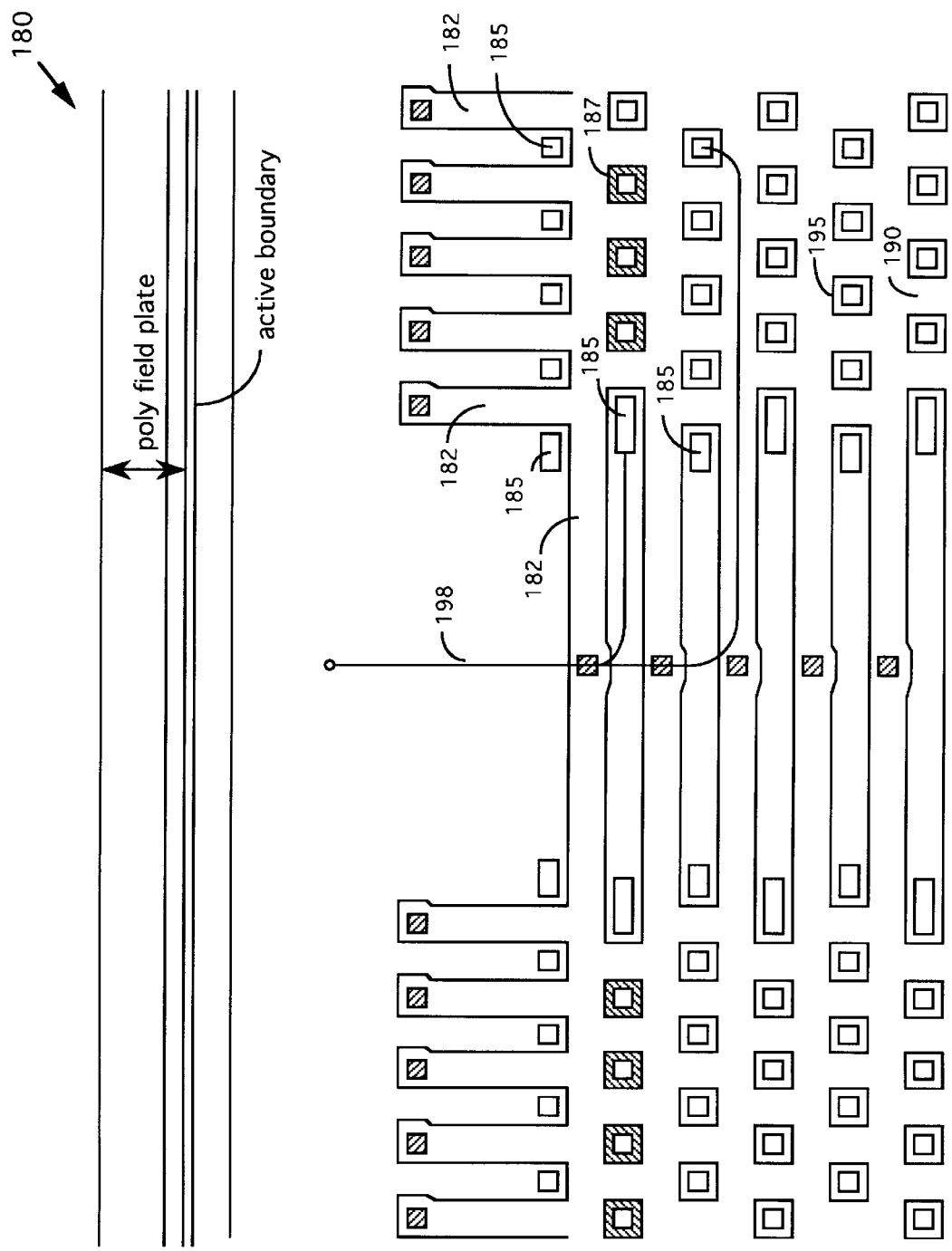
FIG. 5 is a top view of the improved MOSFET device of the present invention wherein the core cell configuration is compared with that implemented in the MOSFET of FIGS. 3A to 3C.

FIG. 5 shows a partial top view of another MOSFET device 180 as an embodiment of the present invention. In addition to the outer pickup guard ring (not shown), the MOSFET device 180 also includes a plurality of inner pickup guarding fences 185 to guard the free charged particles, e.g., the holes, from entering to the core cell area 190. Compared to the cell and poly finger topology as that shown in FIG. 3A, due to the fact that the poly openings of the cells 195 are not arranged directly aligned with the poly fingers 182 in the horizontal direction, the holes which are not picked up by the outer pickup guarding ring, may still travel through a path, e.g., path 198, to reach one or several cells 195. The dummy cells 187, which serve as inner pickup guarding blocks in the vertical direction are not effective to prevent the entrance of the free charged particles from a horizontal path 198. Therefore, the MOSFET device 100 as shown in FIG. 3A, further provides a design feature by arranging at least a corresponding dummy cell 140 directly near a poly finger 135 to block an entrance path of a free charged particle to enter from underneath the poly fingers 135.

In summary, a MOSFET device 100 is disclosed in this invention which is formed in a semiconductor substrate. The MOSFET device 100 includes a core cell area 105 which includes a plurality of cells 108 each includes a drain region 104 formed near a bottom surface of the substrate 102 supporting a plurality of double-diffused vertical cells 108 thereon. Each of the vertical cells 108 including a pn-junction having a body region 112 surrounding a source region 114 and each of the vertical cell further including a gate 116 above the pn-junction, the MOSFET device 100 further includes a termination area 110 which includes an outer pickup guarding ring 120 which includes a ring of metal contact above and in electric contact with a corresponding ring of higher doped body-region 122 underneath for guarding the core cell 105 area by picking up free charged-particles generated in the termination area 110 to prevent the free charged particles from entering the core cell area 105. In a preferred embodiment, the MOSFET device 100 further includes an inner pickup guarding means 140, disposed between the termination area 110 and the core cell area 105 for picking up free charged-particles not yet picked up by the outer pickup guarding means 120 for preventing the free charged particles from entering the core cell area 105. In another preferred embodiment, the MOSFET device 100, the inner pickup guarding means 130 further includes a pickup guarding fence 130, each includes a contact stripe disposed above and in electric contact with a corresponding stripe of higher doped body-regions underneath, surrounding the core cell area 105 and a plurality of pickup guarding blocks 140, each includes a dummy transistor cell having a metal contact above a corresponding higher doped body-region 132 underneath, disposed in the core cell area 105 near the termination area 110 protecting the core cell area 105 where the core cell area 105 is not surrounded by the pickup guarding fence 130. In another preferred embodiment, the MOSFET device 100 further includes a plurality of poly fingers 135 extended from the core cell area 105 to the termination area 110 wherein the pickup guarding blocks 140 are disposed across from the poly fingers 135 in the core cell area 105. In a preferred embodiment, the plurality of poly-fingers 135 extended from the core cell area to the termination area wherein each of the poly fingers 135 is a single open stripe with a poly-contact formed thereon whereby breakdown weak points in the poly-fingers 135 when connected by a gate runner are removed.

Figure 6A:
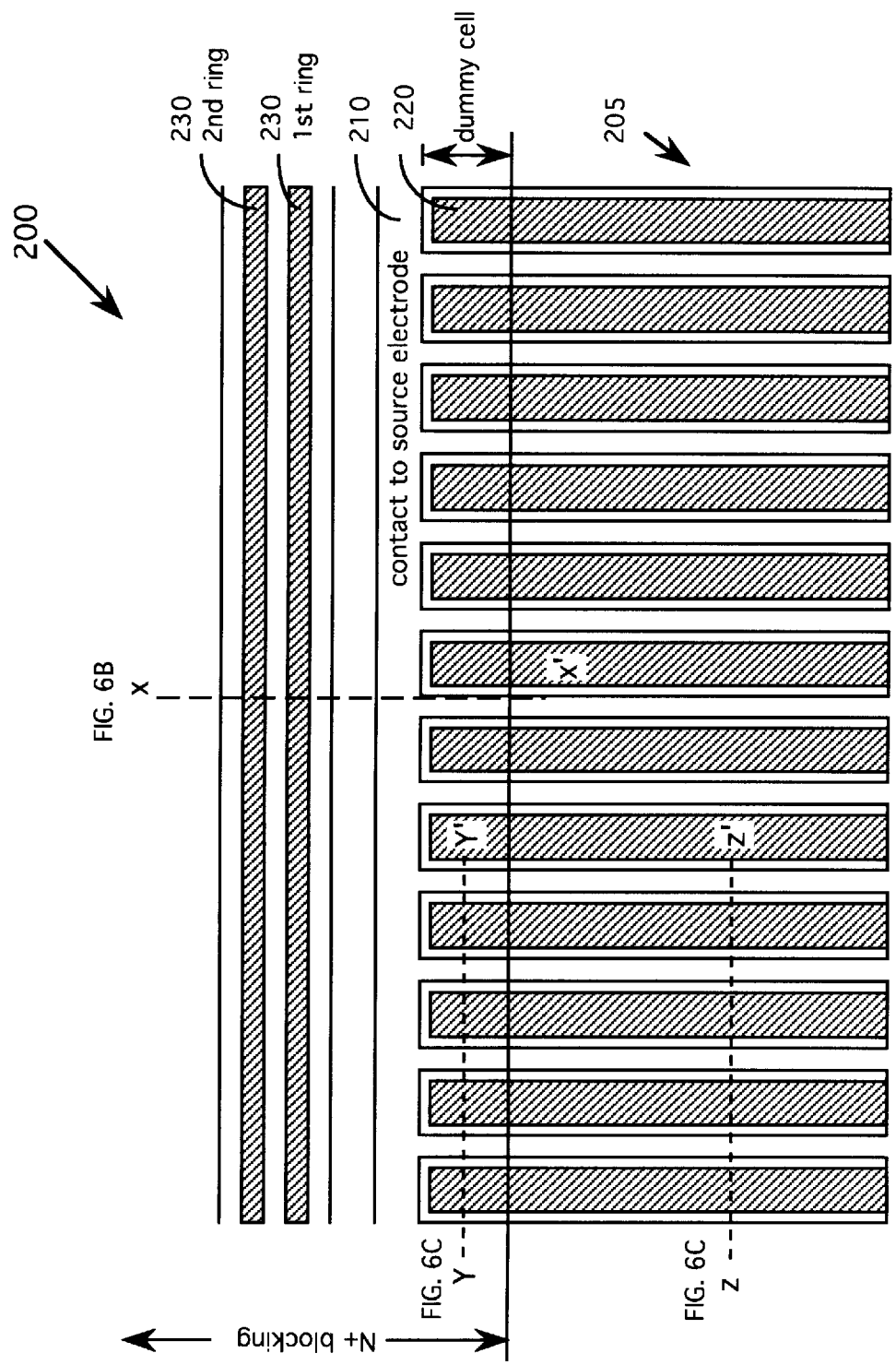
FIGS. 6A to 6E show the top views and cross sectional views of a open stripe MOSFET device implemented with novel termination layout and core cell configuration to improve the breakdown voltage and the device ruggedness.
Figure 6B:
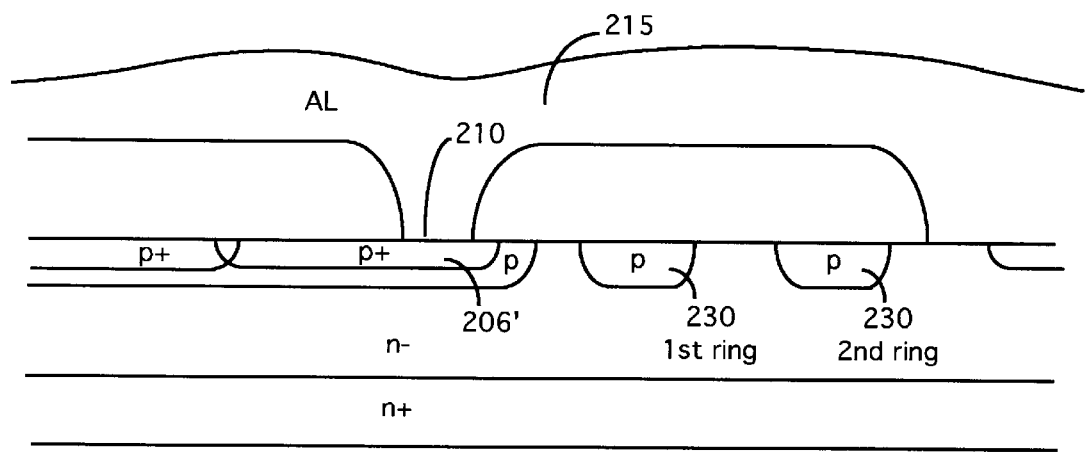
Figure 6C:
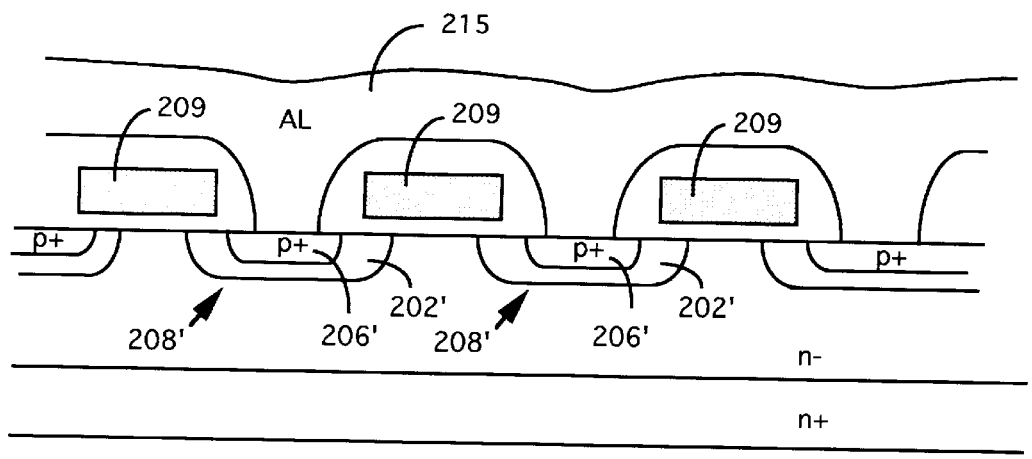
Figure 6D:
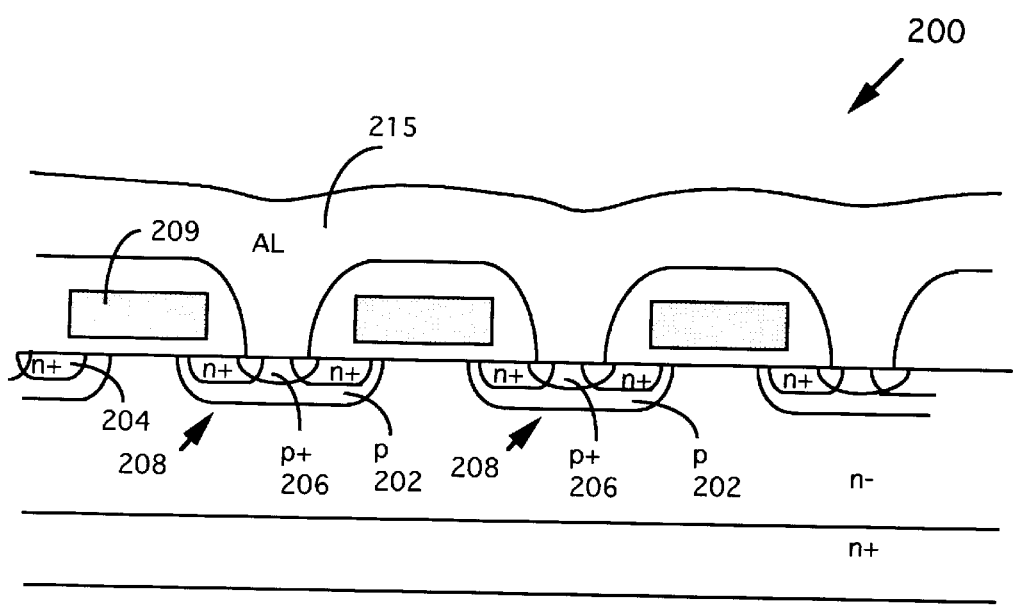

FIG. 6A shows a partial top view, and FIGS. 6B to 6D show the cross sectional views along the lines X—X', Y—Y', and Z—Z' of another MOSFET device 200 of the present invention. Referring first to FIG. 6A, the MOSFET device 200 is an open stripe device wherein the core cell area 205 includes a plurality of open stripe cells 208 as that shown in FIG. 6D along the Z—Z' line. Like a regular cell, each open stripe cell 208 includes a p-body region 202, a $N^+$ source region 204, a $p^+$ region 206 and a gate 209. In this preferred embodiment, the MOSFET 200 further includes an outer charge-pickup guard ring 210 and a section of dummy cells 220. Referring to FIG. 6C for a cross section view of the dummy-cell segment 220 wherein the dummy cell 208' includes only the p-body 202' and the $p^+$ region 206' without including a $n^+$ source region 204 of the regular cells. Referring to FIGS. 6A and 6B, as the free charged particles, e.g., free holes, generated in the termination area which includes several guard rings 230. The free charge particles travel laterally toward the core cell area 205 are first picked up and removed by the outer charge pickup guard ring 210. Any free charged particles which are not picked up by the outer guard ring 210 are then picked up by the dummy cells through the $p^+$ regions 206' which are in electrical contact with the source electrode 215.

Figure 6E:
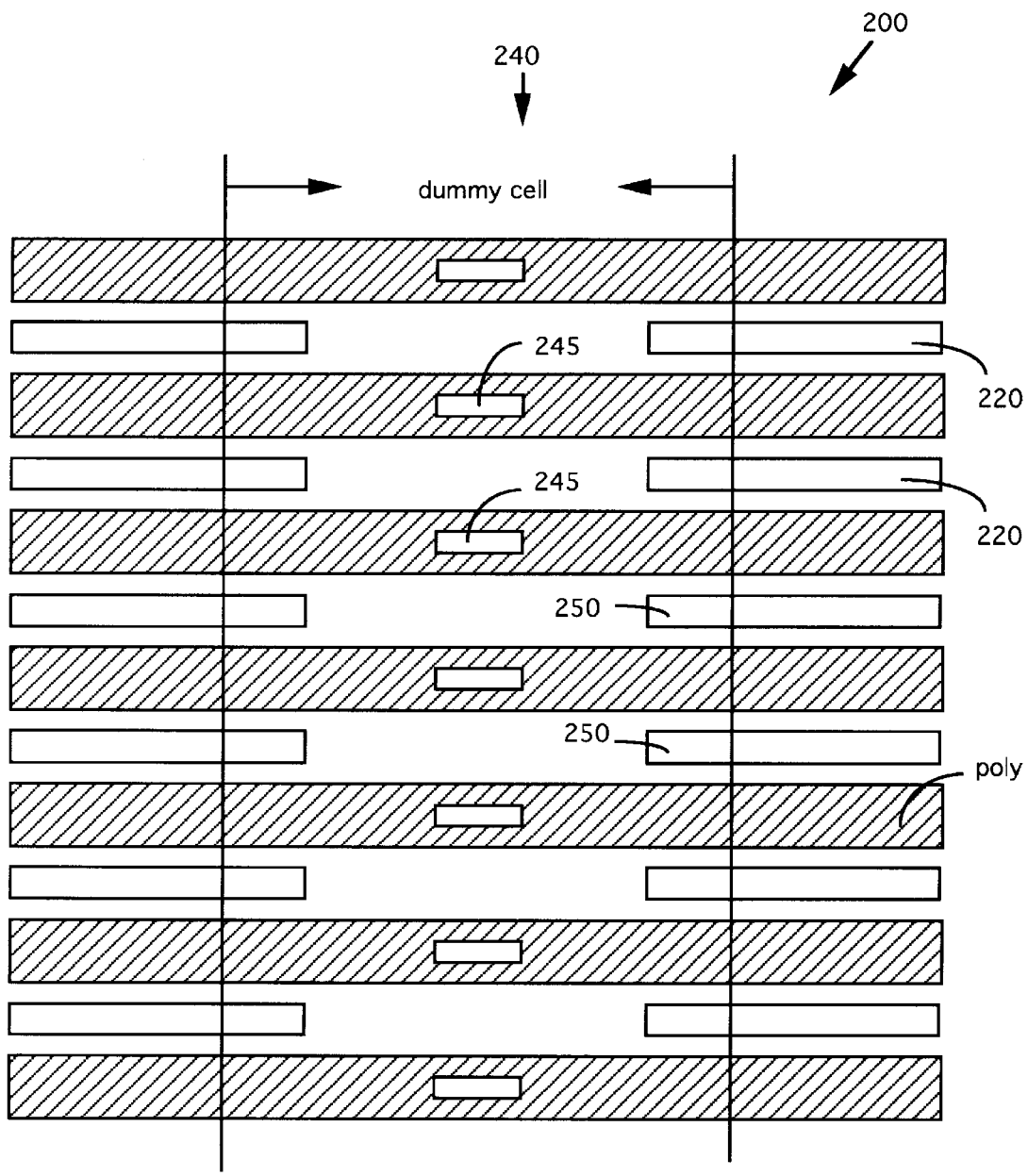

FIG. 6E shows another partial top view of a different section of the MOSFET 200 of the present inventions. The MOSFET device 200 includes an inner section 240 provided for forming a plurality of gate contacts 245 thereon. In this inner section 240, a n+ blocking is applied in the fabrication process such that a plurality of dummy cells 250 are formed where the cell is formed without the n+ source regions with only the p+ regions to pick up the free charged particles for transmitting the free charged particles to the source electrode. This special $n^+$ blocking inner region 240 with the dummy cells 250 provided extra protection for the inner open stripe cells 220 preventing the parasitic bipolar in these cells to be incidentally turned on thus greatly increase the ruggedness of the open stripe cells 220.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A power transistor includes a core cell area comprising a plurality of spaced apart open-stripe power transistor cells, said power transistor further comprising:

a plurality of inner pickup guarding means, disposed between said open stripe transistor cells wherein each of said inner guarding means constituting a dummy cell segment in each of said open strips transistor cells, whereby said dummy cell segment formed with a body region in electrical contact with a source contact for picking up free charged particles therein and preventing said charged particles from entering into said open stripe transistor cells.

2. The power transistor of claim 1 further comprising:

a termination area and an outer pickup guarding means, disposed in said termination area constituting an outer guarding ring of body dopant regions surrounding and guarding said core cell area for picking up free charged-particles generated in said termination area for preventing said free charged particles from entering into said core cell area.

3. A power transistor includes a core cell area comprising a plurality of open-stripe power transistor cells and a termination area, said power transistor further comprising:

an outer pickup guarding means, disposed in said termination area constituting an outer guarding ring surrounding and guarding said core cell area for picking up free charged-particles generated in said termination area for preventing said free charged particles from entering said core cell area;

an inner pickup guarding means, disposed in said open stripe transistor cells near said termination area wherein said inner guarding means constituting a dummy cell segment in each of said open stripe transistor cells whereby said dummy cell segment formed with a body region in electrical contact with a source contact thus picking up free charged particles therein and preventing said charged particles from entering into said open stripe transistor cells.

4. A power transistor includes a core cell area comprising a plurality of power transistor cells and a termination area, said power transistor further comprising:

a plurality of polysilicon fingers extended from said core cell area to said termination area;

an outer pickup guarding means, disposed in said termination area constituting an outer guarding ring surrounding and guarding said core cell area for picking up free charged-particles generated in said termination area for preventing said free charged particles from entering said core cell area;

an inner pickup guarding means, disposed between said termination area and said core cell area for picking up free charged-particles not yet picked up by said outer pickup guarding means for preventing said free charged particles from entering said core cell area;

said inner pickup guarding means includes a plurality of guarding-fence segments surrounding said core cell area between said polysilicon fingers; and said inner pickup guarding means further includes a plurality of dummy cells disposed on the edge of said core cell area wherein each of said polysilicon fingers is guarded by one of said dummy cells disposed immediately adjacent thereto whereby charged particles traveling underneath said polysilicon fingers are pickup by said dummy cells and said core cell area is completely protected by said outer guarding means and said inner guarding means with at least two levels of protection.

5. The power transistor of claim 4 wherein:

said outer and inner guarding means are electrically connected to a source for picking up a plurality of holes during a breakdown in said termination area for preventing said plurality of holes to enter said core cell area.

6. The power transistor of claim 5 further comprising:
said inner and outer guarding means each further includes a p+-doped region in electric contact with a source contact for picking up said plurality of holes.

7. The power transistor of claim 4 further comprising:
said outer and inner guarding means are electrically connected to a source for picking up a plurality of electrons during a breakdown in said termination area for preventing said plurality of electrons to enter said core cell area.

8. The power transistor of claim 7 wherein:
said inner and outer guarding means each further includes a n+-doped region in electric contact with a source contact for picking up a plurality of electrons.

9. A power transistor includes a core cell area comprising a plurality of power transistor cells and a termination area, said power transistor further comprising:
a plurality of polysilicon-fingers extended from said core cell area to said termination area wherein each of said polysilicon fingers is a single polysilicon stripe with a gate-contact formed thereon without a polysilicon gate-runner extended therefrom whereby breakdown weak points resulting from intersections of said polysilicon-fingers and said polysilicon gate runner are removed;
an outer pickup guarding means, disposed in said termination area constituting an outer guarding ring surrounding and guarding said core cell area for picking up free charged-particles generated in said termination area for preventing said free charged particles from entering said core cell area;
an inner pickup guarding means, disposed between said termination area and said core cell area for picking up free charged-particles not yet picked up by said outer pickup guarding means for preventing said free charged particles from entering said core cell area;
said inner pickup guarding means includes a plurality of guarding-fence segments surrounding said core cell area between said polysilicon fingers; and
said inner pickup guarding means further includes a plurality of dummy cells disposed on the edge of said core cell area wherein each of said polysilicon fingers is guarded by one of said dummy cells disposed immediately adjacent thereto whereby charged particles traveling underneath said polysilicon fingers are pickup by said dummy cells and said core cell area is completely protected by said outer guarding means and said inner guarding means with at least two levels of protection.

10. The power transistor of claim 9 wherein:
said outer and inner guarding means are electrically connected to a source for picking up a plurality of holes during a breakdown in said termination area for preventing said plurality of holes to enter said core cell area.

11. The power transistor of claim 10 further comprising:
said inner and outer guarding means each further includes a p+-doped region in electric contact with a source contact for picking up said plurality of holes.

12. A MOSFET device formed in a semiconductor substrate including a core cell area comprising a plurality of cells each includes a drain region formed at a bottom surface of said substrate supporting a plurality of double-diffused vertical cells thereon wherein each of said vertical cells including a pn-junction between a body region and a source region with said body region surrounding said source region and each of said vertical cell further including a gate above said pn-junction, said MOSFET device further comprising:
a termination area opposite said core cell area on said substrate wherein a plurality of polysilicon fingers extended from said core cell area to said termination area;
an outer pickup guarding means disposed in said termination area constituting an outer guarding ring surrounding and guarding said core cell area for picking up free charged-particles generated in said termination area for preventing said free charged particles from entering said core cell area;
an inner pickup guarding means, disposed between said termination area and said core cell area for picking up free charged-particles not yet picked up by said outer pickup guarding means for preventing said free charged particles from entering said core cell area;
said inner pickup guarding means includes a plurality of guarding-fence segments surrounding said core cell area between said polysilicon fingers; and
said inner pickup guarding means further includes a plurality of dummy cells disposed on the edge of said core cell area wherein each of said polysilicon fingers is guarded by one of said dummy cells disposed immediately adjacent thereto whereby charged particles traveling underneath said polysilicon fingers are pickup by said dummy cells and said core cell area is completely protected by said outer guarding means and said inner guarding means with at least two levels of protection.

13. The MOSFET device of claim 12 wherein:
said outer and inner guarding means are electrically connected to a source for picking up a plurality of holes during a breakdown in said termination area for preventing said plurality of holes to enter said core cell area.

14. The MOSFET device of claim 13 further comprising:
said inner and outer guarding means each further includes a p+-doped region in electric contact with a source contact for picking up said plurality of holes.

15. The MOSFET device of claim 12 further comprising:
said outer and inner guarding means are electrically connected to said source region for picking up a plurality of electrons during a breakdown in said termination area for preventing said plurality of electrons to enter said core cell area.

16. The MOSFET device of claim 12 further comprising:
said inner and outer guarding means each further includes a n+-doped region in electric contact with a source contact for picking up a plurality of electrons.

* * * * *